United States Patent [19]

Bagratishvili et al.

[11] Patent Number: 4,608,581
[45] Date of Patent: Aug. 26, 1986

[54] SEMICONDUCTOR LIGHT EMITTER BASED ON GALLIUM NITRIDE AND PROCESS FOR MANUFACTURE THEREOF

[76] Inventors: Givi D. Bagratishvili, ulitsa Pavlova, 13, kv. 8; Rusudan B. Dzhanelidze, utlisa Belinskogo, 24; Vladimir V. Zorikov, ulitsa Klary Tsetkin, 137, kv. 13; Vissarion M. Mikhelashvili, Digomsky massiv, 6 kvartal, korpus 22a, kv. 28; Iosif E. Pekar, ulitsa Meunargia, 22; Rafael I. Chikovani, prospekt Vazha Pshavela, 51, 1 kvartal, 8 korpus, kv. 13; Manana A. Chkhaidze, ulitsa Ardeziani, 30; Svetlana Z. Akopova, ulitsa Tsutskiridze, 13, all of Tbilisi; Viktor B. Bogdanovich, ulitsa Uritskogo, 9, kv. 93; Sergei V. Svechnikov, ulitsa Vladimirskaya, 51/53, kv. 28, both of Kiev; Revaz A. Charmakadze, prospekt Vazha Pshavela, 6 kvartal, korpus 24, kv. 22, Tbilisi, all of U.S.S.R.

[21] Appl. No.: 537,399
[22] PCT Filed: Feb. 2, 1982
[86] PCT No.: PCT/SU82/00002
§ 371 Date: Sep. 1, 1983
§ 102(e) Date: Sep. 1, 1983
[87] PCT Pub. No.: WO83/02685
PCT Pub. Date: Aug. 4, 1983
[51] Int. Cl.4 .......................... H01L 33/00
[52] U.S. Cl. .................................. 357/17
[58] Field of Search ............. 357/16, 17, 30, 61

[56] References Cited
U.S. PATENT DOCUMENTS

| 4,094,704 | 6/1978 | Milnes | 357/30 |
| 4,268,842 | 5/1981 | Jacob et al. | 357/17 |
| 4,396,929 | 8/1983 | Ohki et al. | 357/17 |

*Primary Examiner*—William L. Sikes
*Assistant Examiner*—Robert E. Wise
*Attorney, Agent, or Firm*—Burgess, Ryan & Wayne

[57] ABSTRACT

The semiconductor light emitter comprises a substrate (I) from a single-crystalline material transparent within the visible range of spectrum. Onto the substrate (I) there are deposited: a layer (2) of gallium nitride of the n-type conductivity and, above it, a layer (3) of gallium nitride alloyed with acceptor dopes. The emitter also comprises two metallic electrodes (5) and (6). Onto the electrode (5) a negative-polarity voltage is applied, onto the electrode (6)—a positive-polarity voltage. According to the present invention, over the layer (3) of gallium nitride alloyed with acceptor dopes a layer (4) of an insulating material is formed. The process for manufacturing the semiconductor light emitter comprises epitaxially growing, on a substrate of a single-crystalline material transparent within the visible range of spectrum, a layer of gallium nitride of the n-type conductivity; epitaxially growing, on this layer, a layer of gallium nitride alloyed by acceptor dopes, and forming two electrodes. According to the present invention, prior to the formation of the metallic electrodes on the layer of gallium nitride alloyed by acceptor dopes a layer of an insulating material is formed.

8 Claims, 3 Drawing Figures

SEMICONDUCTOR LIGHT EMITTER BASED ON GALLIUM NITRIDE AND PROCESS FOR MANUFACTURE THEREOF

FIELD OF THE INVENTION

The present invention relates to semiconductor optoelectronic engineering, more specifically to a structure of semiconductive light-emitters based on gallium nitride and to a process for producing same.

BACKGROUND OF THE INVENTION

Semiconductive light emitters based on gallium nitride and processes for making same have been known for a relatively long time; however, no instrument has been developed hitherto which would possess a stable efficiency of a controlled light emission within a broad range of spectrum (from UV to IR inclusive).

Known in the art is a semiconductive light emitter based on gallium nitride (cf. H. P. Maruska, D. A. Stevenson, Solid State Electronics, vol. 17, No. 11, 1974, pp. 1171–1179), comprising a substrate from a single-crystalline material transparent within the visible range of spectrum with applied thereonto layer of gallium nitride of the n-type of conductivity and an overlaying layer of gallium nitride alloyed with acceptor dopes. The instrument has two metallic electrodes. The metallic electrode on which a negative-polarity voltage is applied is formed on the layer of gallium nitride alloyed with acceptor dopes, while the metallic electrode onto which a positive-polarity voltage is applied is formed on the layer of gallium nitride of the n-type conductivity (in the end-face portion of the layer).

The process for the manufacture of this instrument comprises epitaxial growing, on a substrate of a single-crystalline material transparent within the visible range of spectrum, a layer of gallium nitride of the n-type conductivity, epitaxial growing, on this layer, a layer of gallium nitride alloyed with acceptor dopes; formation, on the endface portion of the first layer of a metallic electrode onto which a positive-polarity voltage is applied and, on the second layer, of a metallic electrode onto which a negativepolarity voltage is applied.

In the above-described light-emitting device the grown layers of gallium nitride comprise aggregated microscopic domains forming an integrated single-crystalline facet structure. The surface of the grown layers comprises alternating projections and recesses.

The structural imperfections and morphological characteristics of the surface of the layer of gallium nitride alloyed by acceptor dopes (alternation of projections and recesses) result in a non-uniform distribution of acceptor dopes in the layer, as well as in a non-uniform distribution of the potential over the layer surface. The acceptor dopes are thus accumulated in projections and recesses of the layers in voids between the grains.

In operation of the device (upon application of an external voltage) the above-mentioned factors cause, in the layer of gallium nitride alloyed by acceptor dopes, the formation of current leakage channels (i.e. low-ohmic regions) or irrevocable breakdown of the layers and, hence, in disappearance of the light emission.

To a certain extent the above-mentioned disadvantages have been overcome in a semiconductive light emitter based on gallium nitride (cf. French Pat. No. 2,363,900 published May 5, 1978). This device comprises a substrate from a single crystalline material transparent in the visible range of the spectrum. A layer of gallium nitride of the n-type of conductivity is applied onto the substrate. A layer of gallium nitride alloyed with acceptor dopes and consisting of two sub-layers is deposited onto the former layer. The first sub-layer is only slightly alloyed with acceptor dopes and deposited directly on the layer of gallium nitride of the n-type of conductivity, while the second active sub-layer is strongly alloyed with acceptor dopes and deposited onto the first sub-layer.

The device also has two metallic electrodes. A metallic electrode to which a negative-polarity voltage is applied is formed on an active sub-layer of the layer of gallium nitride alloyed with acceptor dopes. A metallic electrode to which a positive-polarity voltage is applied is formed on the layer of gallium nitride of the n-type of conductivity.

The process for the manufacture of this device comprises epitaxial growing, on a substrate of a single-crystalline material transparent in the visible range of the spectrum, of a layer of gallium nitride of the n-type conductivity; epitaxial growing, on this layer, of a layer of gallium nitride alloyed with acceptor dopes and consisting of two- sub-layers. First grown in the sub-layer weakly alloyed with acceptor dopes and then—the active sub-layer strongly alloyed with acceptor dopes. By way of a precision adjustment of the supply rate of the reagents, a high accuracy of maintaining the growing temperature and a small initial rate of growth of the layer of gallium nitride of the n-type conductivity a smooth surface of the active sub-layer of the layer of gallium nitride alloyed with acceptor dopes is obtained which makes it possible to ensure a more uniform distribution of acceptor impurities within the layer.

Thereafter metallic electrodes are formed. A metallic electrode onto which a negative-polarity voltage is applied is formed on the active sub-layer of gallium nitride layer alloyed with acceptor dopes. A metallic electrode onto which a positive-polarity voltage is applied is formed on the layer of gallium nitride of the n-type conductivity. The second metallic electrode is formed either on the end face of the layer of gallium nitride of the n-type conductivity, or a meso-structure is formed (i.e. the alloyed layer of gallium nitride is etched till the layer of gallium nitride of the n-type conductivity gets uncovered), whereafter on the surface of the uncovered layer a metallic electrode is formed.

As it has been already mentioned hereinabove, a relatively uniform distribution of acceptor dopes over the layer of gallium nitride improves, to a certain extent, quality of the manufactured device.

However, due to the crucial character of the process parameters in the manufacture of the device, the required high reproducibility of the results is not assured. This is due to the fact that it is very difficult to deposit a thickness-uniform thin (about 1,000 Å) active sub-layer, strongly alloyed with acceptor dopes, of the layer of gallium nitride simultaneously with ensuring a uniform distribution of these dopes over the entire sub-layer. In this connection, in the active sub-layer there are low-ohmic regions which causes current leakage through the active sub-layer when the device is in operation, different values of voltage drop in various regions of the active sub-layer and color non-uniformity in light emission from diverse regions of the active sub-layer.

All this does not enable a stable efficiency of the controlled light emission in operation of the device within a broad range of spectrum (from UV to red inclusive).

Furthermore, the complexity of application of the active sub-layer and formation of metallic electrodes extends considerably the process cycle for the manufacture of the device and adds up to its manufacture costs.

DISCLOSURE OF THE INVENTION

The present invention is directed to the provision of a semiconductive light emitter based on gallium nitride and of such a process for making the same which would make it possible, owing to their structural and technological characteristics, to simplify the procedure for the manufacture of the device and ensure, in its operation, a stable efficiency of the controlled light emission within a wide range of spectrum (from UV to red).

This object is accomplished by a semi-conductive light-emitting device based on gallium nitride and comprising a substrate of a single-crystalline material transparent in the visible range of spectrum onto which there are deposited a layer of gallium nitride of the n-type conductivity and, thereover, a layer of gallium nitride alloyed with acceptor dopes, as well as two metallic electrodes; to one of them a negative-polarity voltage is applied and to the other—a positive-polarity voltage; in accordance with the present invention, over the layer of gallium nitride alloyed with acceptor dopes a layer of insulating material is deposited.

The formed layer of the insulating material prevents the low-ohmic breakdown-critical regions of the layer of gallium nitride alloyed with acceptor dopes from the contact with the metallic electrode. This eliminates the possibility of current leakage and appearance of breakdown effects during operation of the device.

Therefore, in operation of the emitter there is ensured a stable efficiency of the controlled light emission within a wide range of spectrum (from UV to red).

Furthermore, there is avoided the necessity of producing a smooth surface of the layer of gallium nitride alloyed with acceptor dopes, whereby the procedure for the device manufacture is considerably simplified, the process cycle is reduced and production costs are lowered.

In the use of a device having an alloyed layer of gallium nitride characterized by a strong non-uniformity of resistance, it is advisable that the layer of the insulating material be formed from alumina.

In the use of a device having an alloyed layer of gallium nitride characterized by a relative uniformity of resistance, it is advisable that the layer of the insulating material be formed from gallium nitride oxide.

The most simple in manufacture is a modification of the device according to the present invention, wherein on the layer of the insulating material there are formed both metallic electrodes. This avoids the necessity of forming an electrode on the end face of the layer of gallium nitride or creating a meso-structure, followed by formation of the electrode.

Furthermore, in the above-described structure of the device the size of light-emitting plates is limited only to the resolving power of photolithography employed for the formation of electrodes, thus enabling the production of multielement linear scales and matrices.

A more effective, as regards the working voltage, modification of the device according to the present invention is the one, wherein on the layer of the insulating material a metallic electrode is formed to which a negative-polarity voltage is applied, while the other electrode is formed on the layer of gallium nitride alloyed with acceptor dopes.

In this modification of the device according to the present invention, upon operation thereof, no increase of the voltage drop inherent in the foregoing modifications of the device is observed. This is caused by shunting of the metallic electrode with the layer of gallium nitride of the n-type conductivity through the channels of leakage of currents in the alloyed layer of gallium nitride.

The object of the invention is also accomplished by that in a process for the manufacture of the semiconductive light emitter according to the present invention comprising epitaxial growing, on a substrate of a single-crystalline material transparent within the visible range of spectrum, of a layer of gallium nitride of the n-type conductivity, epitaxial growing, on this layer, of a layer of gallium nitride alloyed by acceptor dopes and formation of two metallic electrodes, according to the present invention, prior to the formation of the metallic electrodes on the layer of gallium nitride alloyed with acceptor dopes a layer of an insulating material is formed.

This procedure of the manufacture of the device according to the present invention is more simple and cheaper as compared to the prior art procedure, since there is avoided the necessity for producing a smooth surface of the layer of gallium nitride alloyed with acceptor dopes.

The layer of the insulating material prevents the lowohmic breakdown-critical regions of the alloyed layer of gallium nitride from contact with the metallic electrode, thus eliminating the possibility of current leakage and appearance of breakdown effects during the device operation.

In the manufacture of a device having an alloyed layer of gallium nitride characterized by a strong non-uniformity of resistance, it is advisable that the layer of the insulating material be formed by an electrochemical deposition of aluminium in an electrolyte containing an aluminium salt, followed by an anodic oxidation of the deposited aluminium.

In the manufacture of a device having an alloyed layer of gallium nitride characterized by a relative uniformity of resistance, it is advisable that the layer of the insulating material be formed by way of an anodic oxidation of the layer of gallium nitride alloyed with acceptor dopes.

BRIEF DESCRIPTION OF DRAWINGS

The present invention is further illustrated by the following specific examples of its particular embodiments with reference given to the accompanying drawings, wherein.

THE BEST MODE FOR CARRYING-OUT THE INVENTION

Figure 1:
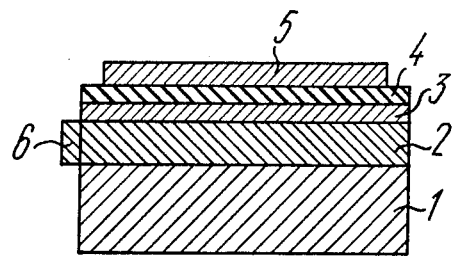
FIG. 1 shows a semiconductive light-emitting device based on gallium nitride according to the present invention, elevation view.

The semiconductive light-emitting device based on gallium nitride according to the present invention comprises a substrate 1 (FIG. 1 of the accompanying drawings) from a single-crystalline material transparent in the visible range of spectrum (e.g. sapphire). On the substrate 1 a layer 2 of gallium nitride of the n-type conductivity is deposited. Over this layer 2 a layer 3 of gallium nitride alloyed with acceptor dopes is deposited. As the alloying acceptor dopes elements of Group II of the periodic system may be used such as Zn, Be, Cd, Li and Mg.

According to the present invention, over the layer 3 of gallium nitride alloyed with acceptor dopes a layer 4 of an insulating material is formed.

In operating a device having an alloyed layer 3 of gallium nitride characterized by a strong non-uniformity of resistance, it is advisable that the layer 4 be formed from alumina.

In the use of a device having an alloyed layer 3 of gallium nitride characterized by a relative uniformity of resistance it is advisible that the layer 4 be formed from gallium nitride oxide.

The device comprises two metallic electrodes 5 and 6. The metallic electrode 5, to which a negative-polarity voltage is applied is formed on the layer 4 of the insulating material. The metallic electrode 6, to which a positive-polarity voltage is applied is formed on the end-face portion of the layer 2 of gallium nitride of the n-type conductivity.

Figure 2:
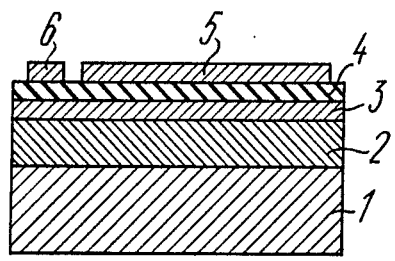
FIG. 2 shows a modification of the device according to the present invention with the electrodes formed on the layer of the insulating material according to the present invention, elevation view.

The most simple in manufacture is the embodiment of the device according to the present invention which is shown in FIG. 2 of the accompanying drawings. The structural modification of this embodiment of the device is substantially the same as it has been described hereinabove. However, in this embodiment on the layer 4 of the insulating material a metallic electrode 5 is formed to which a negative-polarity voltage is applied. A metallic electrode 6 to which a positive polarity voltage is applied is formed on the layer 3 of gallium nitride alloyed with acceptor dopes.

The process for the manufacture of the semi-conductive light-emitting device according to the present invention based on gallium nitride comprises the following operations.

Figure 3:
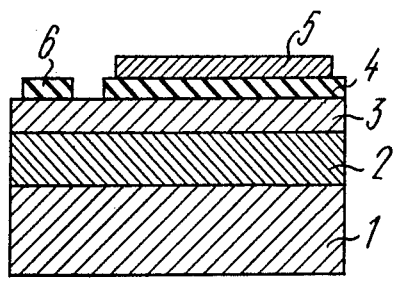
FIG. 3 shows a modification of the device according to the present invention having one electrode formed on the layer of the insulating material, the other—on the layer of gallium nitride alloyed with acceptor dopes, elevation view.

On a substrate 1 (cf. FIGS. 1 to 3 of the accompanying drawings) from a single-crystalline material transparent in the visible range of spectrum (for example, sapphire) a layer 2 of gallium nitride of the n-type conductivity is epitaxially grown by the chloride-hydride method. On this layer 2 a layer 3 of gallium nitride alloyed with acceptor dopes (e.g. zinc) is epitaxially grown. On the layer 3 a layer 4 of an insulating material is formed.

In the manufacture of a device having an alloyed layer 3 of gallium nitride characterized by a strong non-uniformity of resistance a layer 4 is formed by an electrochemical deposition of aluminium in an electrolyte containing a salt of aluminium, followed by an anodic oxidation of the deposited aluminium.

In the manufacture of a device having an alloyed layer 3 of gallium nitride characterized by a relative uniformity of resistance, the layer 4 is formed by an anodic oxidation of the layer 3 of gallium nitride alloyed with acceptor dopes.

During the formation of the layer 4 the insulating material is deposited mainly in low-ohmic regions of the alloyed layer 3 of gallium nitride.

Thereafter, the formation of metallic electrodes 5 and 6 are formed. To this end, a metal layer is sprayed (e.g. aluminium) and the electrodes 5 and 6 are then formed by the method of photolithography.

Some specific examples illustrating the manufacture of the semiconductive light-emitting device based on gallium nitride according to the present invention are given hereinbelow.

EXAMPLE 1

On a sapphire support with the orientation (1012) a layer of gallium nitride of the n-type conductivity is epitaxially grown by the chloride-hydride method. The growing is effected at the temperature of $1,040\pm2°$ C. for 600 seconds. The layer thickness is $10^{-5}$ m.

A layer of zinc-alloyed gallium nitride is epitaxially grown on the above-mentioned layer. The growing is effected at the temperature of $900\pm2°$ C. for 120 seconds. The temperature of the source of the alloying dope is $580\pm3°$ C. The layer thickness is equal to $8.10^{-7}$ m.

The thus-produced structure is placed into an electrolyte containing a salt of aluminium and having the following composition:

aluminium bromide (anhydrous), kg 0,080
hydrogen bromide (gaseous), kg 0,010
paraffin, kg 0,015
dimethylbenzene, $m^3$ $10^{-3}$.

The layer of the insulating material was formed by way of an electrochemical deposition of aluminium in this electrolyte. The deposition of aluminium was effected for 60 seconds at the temperature of $23\pm2°$ C. and the current density of 100 A/$m^2$.

Thereafter an anodic oxidation of the deposited aluminium was effected in an aqueous solution of oxalic acid $C_2H_2O_4$. The aqueous solution of oxalic acid was taken in the amount of 50 kg/$m^3$ of water. The anodic oxidation of the deposited aluminium was effected for 120 seconds at the temperature of $30\pm2°$ C. and the current density of 200 A/$m^2$.

Then a layer of aluminium with the thickness of $6\cdot10^{-7}$ m was deposited onto the thus-obtained layer of the insulating material and electrodes were formed by the method of photolithography.

The semiconductive light-emitting device manufactured by the above-described process has the following characteristics:

light-emission wavelength,m $(4.6-5)\times10^{-7}$
working voltage, V 5-8
luminous intensity at current equal to $(5-10)\times10^{-3}$ A, candelae or above $10^{-4}$.

EXAMPLE 2

In the manufacture of the device the operations of epitaxial growing on a sapphire support, of the layer of gallium nitride of the n-type conductivity and the layer of gallium nitride alloyed by zinc were carried out in much the same manner as described in the foregoing Example 1.

The layer of the insulating material was formed by way of an anodic oxidation of the alloyed layer of gallium nitride. To this end, the resulting structure was placed into an electrolyte in the form of a solution of pyrophosphoric acid $H_4P_2O_7$ in furfuryl alcohol $C_5H_6O_2$ and an anodic oxidation of the alloyed layer of gallium nitride was then carried out. The anodic oxidation was conducted for 90 seconds at the temperature of $18\pm2°$ C. and current density of 100 A/m$^2$.

The formation of metallic electrodes was carried out as described in Example 1 hereinbefore.

The thus-manufactured semiconductive light-emitting device has the following characteristics:
light-emission wavelength, m $(4.6-5.0)\times 10^{-7}$
working voltage, V 5–8
luminous intensity at a current of $(5-10)\times 10^{-3}$ A, candelae equal to or above $10^{-4}$.

It is quite clear that given hereinbefore are only some examples of embodiments of the present invention allowing for various modifications and changes obvious for those skilled in the art. Other modifications are also possible, provided that they do not go beyond the scope and subject matter of the present invention as defined by the claims.

INDUSTRIAL APPLICABILITY

The present invention can be most successfully employed in the manufacture of semiconductive light-emitting devices (such as opto-isolators and optronic matrices) for various functional applications.

We claim:

1. A semiconductor light emitter based on gallium nitride comprising a substrate of a single-crystalline material transparent within the visible range of spectrum, a layer of gallium nitride of n-type conductivity deposited on said single crystalline material, an overlapping layer of gallium nitride alloyed with acceptor dopes, and two metallic electrodes, one of which is supplied with a negative-polarity voltage and the other is supplied with a positive-polarity voltage, characterized by an insulating layer means for limiting the flow of large currents through low-ohmic regions of the layer of gallium nitride alloyed by acceptor dopes by providing complete insulation of the layer of gallium nitride alloyed by acceptor dopes low-ohmic regions of the layer of gallium nitride alloyed by acceptor, the insulating layer means including a layer of insulating material formed over the layer of gallium nitride alloyed by acceptor dopes.

2. A semiconductor light emitter according to claim 1, characterized in that the insulating layer means comprises alumina.

3. A semiconductor light emitter according to claim 1, characterized in that the insulating layer means comprises gallium nitride oxide.

4. A semiconductor light emitter according to any one of the insulating foregoing claims 1 to 3, characterized in that on the layer of both metallic electrodes are formed.

5. A semiconductor light emitter according to any one of the foregoing claims 1 to 3, characterized in that on the insulating layer means a metallic electrode is formed onto which a negative-polarity voltage is applied and the other electrode is formed on the layer of gallium nitride alloyed with acceptor dopes.

6. A process for the manufacture of a semi-conductor light emitter according to claim 1, comprising the steps of epitaxially growing, on a substrate from a single-crystalline material transparent within the visible range of spectrum, a layer of gallium nitride of n-type conductivity, epitaxially growing on said layer, a layer of gallium nitride alloyed by acceptor dopes, and forming two metallic electrodes, characterized by a step of forming an insulating layer means on the layer of gallium nitride alloyed by acceptor dopes prior to said step of forming the metallic electrodes.

7. A process according to claim 6, characterized by forming the insulating layer means by electrochemical deposition of aluminium in an electrolyte containing a salt of aluminium, followed by anodic oxidation of the deposited aluminium.

8. A process according to claim 6, characterized by forming insulating layer means by an anodic oxidation of the layer of gallium nitride alloyed by said acceptor dopes.

* * * * *